(12) United States Patent
Ni

(10) Patent No.: US 11,380,742 B2
(45) Date of Patent: Jul. 5, 2022

(54) DISPLAY PANEL INCLUDING A SECOND SUPPORT COLUMN INSIDE A FIRST SUPPORT COLUMN

(71) Applicant: Wuhan China Star Optoelectronics Semiconductor Display Technology Co., Ltd., Wuhan (CN)

(72) Inventor: Jing Ni, Wuhan (CN)

(73) Assignee: Wuhan China Star Optoelectronics Semiconductor Display Technology Co., Ltd., Wuhan (CN)

(*) Notice: Subject to any disclaimer, the term of this patent is extended or adjusted under 35 U.S.C. 154(b) by 39 days.

(21) Appl. No.: 16/640,070

(22) PCT Filed: Oct. 9, 2019

(86) PCT No.: PCT/CN2019/110041
§ 371 (c)(1),
(2) Date: Feb. 19, 2020

(87) PCT Pub. No.: WO2020/258582
PCT Pub. Date: Dec. 30, 2020

(65) Prior Publication Data
US 2020/0411613 A1    Dec. 31, 2020

(30) Foreign Application Priority Data
Jun. 27, 2019 (CN) .......................... 201910566856.8

(51) Int. Cl.
*H01L 29/08* (2006.01)
*H01L 27/32* (2006.01)
*H01L 51/52* (2006.01)

(52) U.S. Cl.
CPC ........ *H01L 27/3246* (2013.01); *H01L 51/525* (2013.01)

(58) Field of Classification Search
CPC ............. H01L 27/3246; H01L 27/3283; H01L 51/525
USPC .............................................. 257/40, 99, 100
See application file for complete search history.

(56) References Cited

U.S. PATENT DOCUMENTS

2016/0133874 A1* 5/2016 Kim ................... H01L 27/3241
257/40
2019/0027543 A1 1/2019 Zhang et al.

FOREIGN PATENT DOCUMENTS

| CN | 105929607 | 9/2016 |
| CN | 106647052 | 5/2017 |
| CN | 106920831 | 7/2017 |
| CN | 106920831 A * | 7/2017 |
| CN | 107331791 | 11/2017 |

(Continued)

*Primary Examiner* — Phuc T Dang

(57) ABSTRACT

A display panel includes a light emitting layer, and the light emitting layer includes a pixel defining layer, a plurality of light emitting structures, and a plurality of supporting structures located on the pixel defining layer. Each of the supporting structures includes a first support column and a second support column, the first support column is a hollow cylinder, the second support column is located inside the first support column, a height of the second support column is greater than a height of the first support column, and a shortest distance between the first support column and the second support column is greater than or equal to a radius or a side length of the second support column.

14 Claims, 3 Drawing Sheets

(56) References Cited

FOREIGN PATENT DOCUMENTS

CN 208622725 3/2019
JP 2006-253097 9/2006

* cited by examiner

DISPLAY PANEL INCLUDING A SECOND SUPPORT COLUMN INSIDE A FIRST SUPPORT COLUMN

RELATED APPLICATIONS

This application is a National Phase of PCT Patent Application No. PCT/CN2019/110041 having International filing date of Oct. 9, 2019, which claims the benefit of priority of Chinese Patent Application No. 201910566856.8 filed on Jun. 27, 2019. The contents of the above applications are all incorporated by reference as if fully set forth herein in their entirety.

FIELD AND BACKGROUND OF THE INVENTION

The present invention relates to the field of electronic display, and in particular, to a display panel.

At present, light emitting structures of organic light emitting diodes (OLED) are produced by an evaporation process, and a metal mask is used in the process.

In the evaporation process, a substrate and a mask are combined by magnetic force. The larger a distance between the substrate and the mask, the larger a shadow of the film formation area. If the distance between the substrate and the mask is too short, there would be a risk that the substrate is scratched. Referring to FIG. 1, in the prior art, support columns are generally formed on a planarization layer to define the distance between the mask and the substrate. However, friction between the mask and the support columns can cause debris. These debris cannot be covered by subsequent film layer, thereby forming defects on the display panel, causing water and oxygen to intrude and invalidating the display panel.

SUMMARY OF THE INVENTION

The present application provides a display panel to solve the technical problem of debris generated by friction between support column and mask in the prior art.

In order to solve the above problems, the present application provides a display panel comprising a light emitting layer, wherein the light emitting layer comprises:

a pixel defining layer having a plurality of openings;

a plurality of light emitting structures disposed in the plurality of openings;

a plurality of supporting structures located on the pixel defining layer;

wherein each supporting structure comprises a first support column and a second support column, the first support column is a hollow cylinder, the second support column is located inside the first support column, a height of the second support column is greater than a height of the first support column.

According to one aspect of the application, wherein a central axis of the first support column and a central axis of the second support column overlap.

According to one aspect of the application, wherein a projection of the first support column on a light emitting surface of the display panel and a projection of the second support column on the light emitting surface of the display panel have a same shape.

According to one aspect of the application, wherein the projection of the first support column on the light emitting surface of the display panel covers the projection of the second support column on the light emitting surface of the display panel.

According to one aspect of the application, wherein an area of the projection of the first support column on the light emitting surface of the display panel is greater than or equal to 4 times an area of the projection of the second support column on the light emitting surface of the display panel.

According to one aspect of the application, wherein the second support column is a hollow cylinder.

According to one aspect of the application, wherein the first support column comprises a first surface facing the second support column and a second surface away from the second support column, a projection of the first surface on a light emitting surface of the display panel is one of a triangle, a rectangle, a circle, or a polygon, a projection of the second surface on the light emitting surface of the display panel is one of a triangle, a rectangle, a circle, or a polygon.

According to one aspect of the application, wherein the second support column comprises a third surface facing the first support column, a projection of the third surface on the light emitting surface of the display panel is one of a triangle, a rectangle, a circle, or a polygon.

According to one aspect of the application, wherein the second support column comprises a third surface facing the first support column and a fourth surface away from the first support column, a projection of the third surface on the light emitting surface of the display panel is one of a triangle, a rectangle, a circle, or a polygon, a projection of the fourth surface on the light emitting surface of the display panel is one of a triangle, a rectangle, a circle, or a polygon.

According to one aspect of the application, wherein the supporting structure further comprises a third support column, the third support column is a hollow cylinder surrounding the first support column, and a height of the third support column is less than a height of the first support column.

According to one aspect of the application, wherein a central axis of the third support column and a central axis of the first support column overlap.

According to one aspect of the application, wherein the projection of the first support column on the light emitting surface of the display panel and a projection of the second support column on the light emitting surface of the display panel have a same shape.

According to one aspect of the application, wherein a projection of the third support column on the light emitting surface of the display panel covers the projection of the first support column on the light emitting surface of the display panel.

According to one aspect of the application, wherein an area of the projection of the third support column on the light emitting surface of the display panel is greater than or equal to 4 times an area of the projection of the first support column on the light emitting surface of the display panel.

According to one aspect of the application, wherein the display panel further comprises an encapsulation structure comprising a first inorganic film covering the light emitting structure and the supporting structure and a first organic film positioned above the first inorganic film;

wherein a thickness of the first inorganic film is greater than a height of the first support column.

According to one aspect of the application, the thickness of the first inorganic film is greater than a height of the second support column.

Beneficial Effects

The present application improves upon supporting structures of display panels in the prior art. A supporting structure of the present application includes a first support column and a second support column. The first support column is a hollow cylinder, and the second support column is located inside the first support column. A height of the second support column is greater than a height of the first support column. This arrangement ensures that when a light emitting structure is formed, only the second support column is in contact with a mask. At the same time, debris generated by friction between the second support column and the mask will fall into a region between the first support column and the second support column. That is, it falls inside the supporting structure instead of falling directly onto the display panel. The present application is capable of preventing film formation abnormalities due to debris generated by friction between the support columns and the mask.

DESCRIPTION OF SPECIFIC EMBODIMENTS OF THE INVENTION

Figure 1:
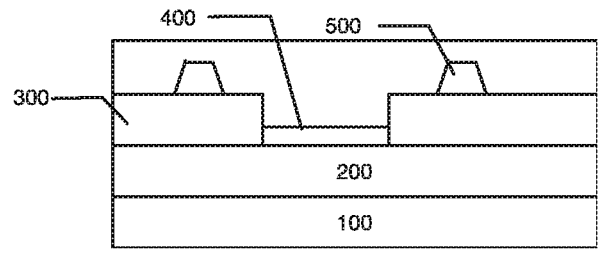
FIG. 1 is a structural diagram of a display panel of the present application.

Description of following embodiment, with reference to accompanying drawings, is used to exemplify specific embodiments which may be carried out in the present disclosure. Directional terms mentioned in the present disclosure, such as "top", "bottom", "front", "back", "left", "right", "inside", "outside", "side", etc., are only used with reference to orientation of the accompanying drawings. Therefore, the directional terms are intended to illustrate, but not to limit, the present disclosure. In the drawings, components having similar structures are denoted by same numerals.

The present application provides a display panel to solve the technical problem of debris generated by friction between support columns and mask in the prior art. The present application will be described in detail below with reference to the accompanying drawings.

Referring to FIG. 1, the present application provides a display panel including a substrate 100, a thin film transistor layer 200, and a light emitting layer; the light emitting layer including a pixel defining layer 300, a plurality of light emitting structures 400, and a plurality of supporting structures 500. The pixel defining layer 300 has a plurality of openings, the plurality of light emitting structures 400 are located in the plurality of openings, and the plurality of supporting structures are located on the pixel defining layer 300.

Figure 2:
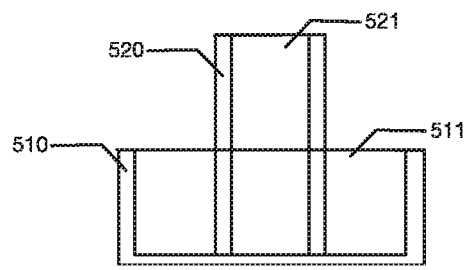
FIG. 2 is a structural diagram of a support column in a first embodiment of the present application.

In the present application, each of the supporting structures 500 comprises a first support column 510 and a second support column 520. The first support column 510 is a hollow cylinder, and it has a first cavity 511, as shown in FIG. 2. The second support column 520 is located inside the first cavity 511 of the first support column 510. Referring to FIG. 2, the first support column 510 has a first cavity 511, and the second support column 520 is located in the first cavity 511 of the first support column 510. A height of the first support column 510 is less than or equal to 2 microns and greater than or equal to 1 micron. A height of the second support column 520 is greater than a height of the first support column 510.

In the present application, the display panel further includes an encapsulation structure covering the light emitting structures 400 and the plurality of supporting structures 500, and the encapsulation structure is a thin film encapsulation structure. The thin film encapsulation structure includes at least two inorganic encapsulation thin films and at least one organic encapsulation thin film on the inorganic encapsulation thin film. The inorganic encapsulating thin film in contact with the supporting structures 500 is a first inorganic thin film. In this embodiment, a height of the first support column 510 is less than a thickness of the first inorganic thin film. In this way, the first inorganic thin film and the first cavity 511 of the first support column 510 can form a sealed space, thereby sealing debris falling into the first cavity 511 in the sealed space, and preventing it from being detached from the first cavity 511 and generating debris in the display panel. Preferably, the height of the second support column 520 is also less than the thickness of the first inorganic thin film.

This arrangement is such that only the second support column 520 is in contact with a mask when forming the light emitting structure. At the same time, the debris generated by friction between the second support column 520 and the mask will fall into the first cavity 511 instead of falling directly onto the display panel. In this embodiment, in order to enhance a collection capability of the supporting structures for debris, the second support column 520 is a hollow cylinder, and the second support column has a second cavity 521.

In the present application, in order to make the debris generated by the friction between the second support column 520 and the mask accurately fall into the first cavity 511, a central axis of the first support column 510 and a central axis of the second support column 520 overlap.

In the present application, the first support column 510 includes a first surface facing the second support column 520 and a second surface remote from the second support column 520. A projection of the first surface on a light emitting surface of the display panel is any one of a triangle, a rectangle, a circle, or a polygon. A projection of the second surface on the light emitting surface of the display panel is any one of a triangle, a rectangle, a circle, or a polygon.

In the present application, the second support column 520 includes a third surface facing the first support column 510 and a fourth surface remote from the first support column 510. A projection of the third surface on the light emitting surface of the display panel is any one of a triangle, a rectangle, a circle, or a polygon. A projection of the fourth surface on the light emitting surface of the display panel is any one of a triangle, a rectangle, a circle, or a polygon.

In the present application, a projection of the first support column 510 on the light emitting surface of the display panel and a projection of the second support column 520 on the light emitting surface of the display panel overlaps. The projection of the first support column 510 on the light emitting surface of the display panel covers the projection of the second support column 520 on the light emitting surface of the display panel.

Figure 3:
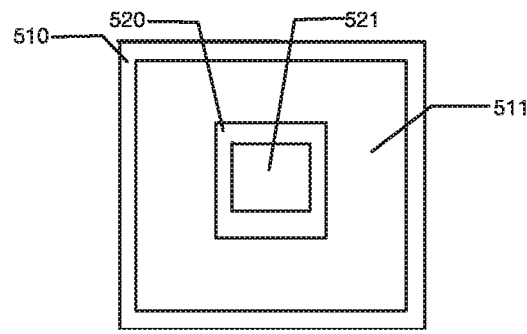
FIG. 3 is a plan view of the support column in the first embodiment of the present application.

Referring to FIG. 3, in the first embodiment of the present invention, the projections of the first surface and the second surface of the first support column 510 on the light emitting surface of the display panel are both rectangular. The projections of the third surface and the fourth surface of the second support column 520 on the light emitting surface of the display panel are also rectangular.

Figure 4:
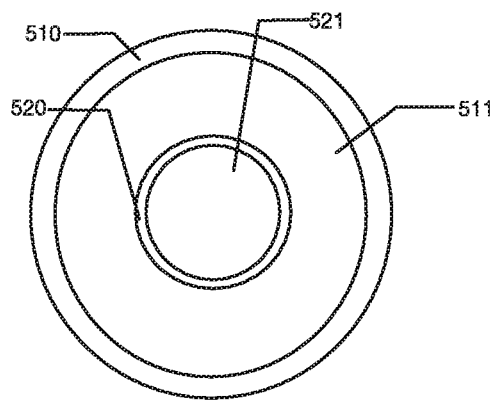
FIG. 4 is a plan view of a support column in a second embodiment of the present application.

Referring to FIG. 4, in the second embodiment of the present invention, the projections of the first surface and the second surface of the first support column 510 on the light emitting surface of the display panel are both circles. The projections of the third surface and the fourth surface of the second support column 520 on the light emitting surface of the display panel are also circles.

Figure 5:
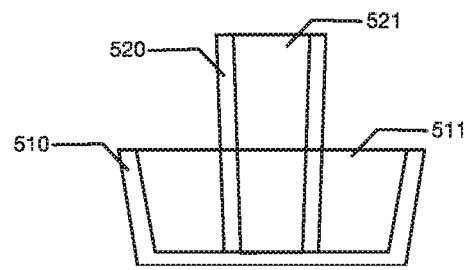
FIG. 5 is a structural diagram of a support column in a third embodiment of the present application.
Figure 6:
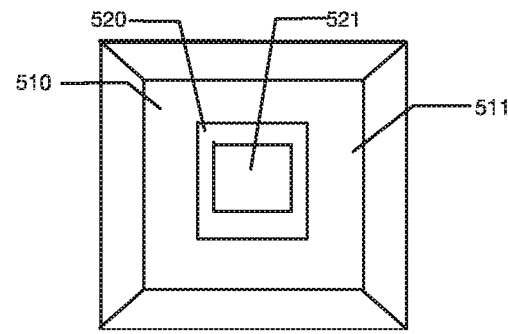
FIG. 6 is a plan view of the support column in the third embodiment of the present application.

Referring to FIG. 5 and FIG. 6, FIG. 5 is a structural diagram of a support column in a third embodiment of the present application, and FIG. 6 is a top view of the support column in the third embodiment of the present application. In order to enhance a collection effect of the first cavity 511 on the debris, in this embodiment, an area of the top of the first cavity is larger than an area of the bottom of the first cavity, that is, a cross section of the first cavity in a vertical direction is an inverted trapezoidal structure. Similarly, a cross section of the second cavity 521 in the vertical direction is also an inverted trapezoidal structure. Compared to the first embodiment and the second embodiment, the top of the cavity of the inverted trapezoidal structure has a larger opening, which is capable of collecting debris within a larger range.

In the present application, in order to ensure that the debris generated by friction between the second support column 520 and the mask falls into the first cavity 511 instead of being scattered onto the display panel, a volume of the first cavity 511 should be large enough to have sufficient space to collect the debris. Therefore, in the present application, an area of the projection of the first support column 510 on the light emitting surface of the display panel is greater than or equal to 4 times an area of the projection of the second support column 520 on the light emitting surface of the display panel.

Take the area of the projection of the first support column 510 on the light emitting surface of the display panel, which is equal to 4 times the area of the projection of the second support column 520 on the light emitting surface of the display panel, as an example. Referring to FIG. 2 and FIG. 4, when the projections of the first support column 510 and the second support column 520 on the light emitting surface of the display panel are all circular, the shortest distance between the first support column 510 and the second support column 520 is equal to a radius of the second support column 520. Referring to FIG. 2 and FIG. 3, when the projections of the first support column 510 and the second support column 520 on the light emitting surface of the display panel are both rectangular, the shortest distance between the first support column 510 and the second support column 520 is equal to a side length of the second support column 520.

If the area of the projection of the first support column 510 on the light emitting surface of the display panel is less than 4 times the area of the projection of the second support column 520 on the light emitting surface of the display panel, the shortest distance between the first support column 510 and the second support column 520 will be less than the radius of the second support column 520. In this case, the debris easily falls over the boundary of the first support column 510 onto the display panel, affecting the technical effects of the present application.

Figure 7:
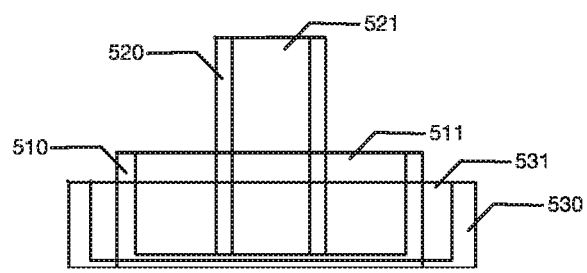
FIG. 7 is a structural diagram of a support column in a fourth embodiment of the present application.

Referring to FIG. 7, the supporting structure 500 further comprises a third support column 530. The third support column 530 is a hollow cylinder surrounding the first support column 510, the third support column 530 has a third cavity 531, and a height of the third support column 530 is less than the height of the first support column 510.

In the present application, a central axis of the third support column 530 and the central axis of the first support column 510 overlap. The projection of the first support column 510 on the light emitting surface of the display panel and the projection of the second support column 520 on the light emitting surface of the display panel have a same shape. A projection of the third support column 530 on the light emitting surface of the display panel covers the projection of the first support column 510 on the light emitting surface of the display panel. An area of the projection of the third support column 530 on the light emitting surface of the display panel is greater than or equal to 4 times the area of the projection of the first support column 510 on the light emitting surface of the display panel. The third support column 530 and the third cavity 531 can further enhance a collection range of the supporting structure 500 for the debris, which is advantageous for enhancing the collection capability of the supporting structure 500 for the debris.

Figure 8:
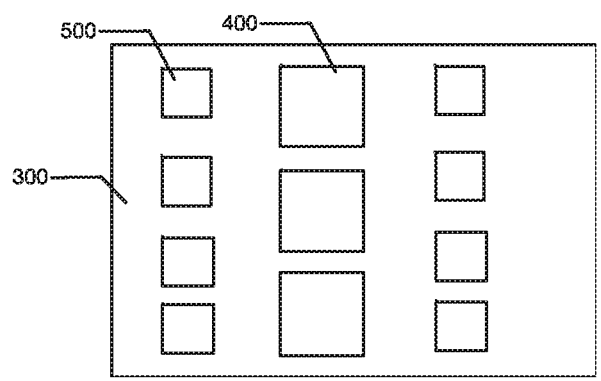
FIG. 8 is a plan view of a display panel in a fifth embodiment of the present application.
Figure 9:
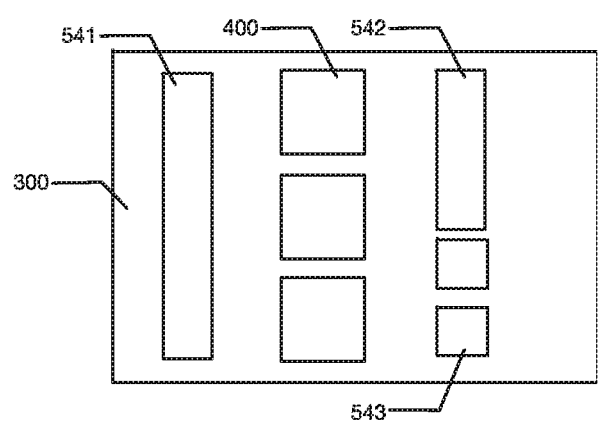
FIG. 9 is a plan view of a display panel in a sixth embodiment of the present application.

Referring to FIG. 8 and FIG. 9, FIG. 8 is a top view of a display panel in a fifth embodiment of the present application, and FIG. 9 is a top view of a display panel in a sixth embodiment of the present application.

In the present application, a projection of the supporting structure 500 on the light emitting surface of the display panel could be a central symmetrical pattern, as shown in FIG. 8. It can also be an axisymmetric figure, as shown in FIG. 9. Referring to FIG. 8, the plurality of supporting structures 500 have a same structure. The supporting structures 500 having the same structure has a same manufacturing parameter and fabrication standard, which can reduce process complexity.

Referring to FIG. 9, the plurality of supporting structures 500 have different structures. Specifically, the plurality of supporting structures 500 include a supporting structure 541 having a first length, a supporting structure 542 having a second length, and a supporting structure 543 having a third length. The first length is greater than the second length, and the second length is greater than the third length. The supporting structure 541 having the first length has a better support effect, while the supporting structure 543 having the third length has a relatively strong collection ability for debris. In practice, shapes of the supporting structures 500 can be selected according to requirements. The shapes of the supporting structures 500 in the embodiment of the present application are only for explaining, and should not be construed as limiting the present application.

The present application improves upon supporting structures of display panels in the prior art. A supporting structure of the present application includes a first support column and a second support column. The first support column is a hollow cylinder, and the second support column is located inside the first support column. A height of the second support column is greater than a height of the first support column. This arrangement ensures that when a light emitting structure is formed, only the second support column is in contact with a mask. At the same time, debris generated by friction between the second support column and the mask will fall into a region between the first support column and the second support column. That is, it falls inside the supporting structure instead of falling directly onto the display panel. The present application is capable of preventing film formation abnormalities due to debris generated by friction between the support columns and the mask.

As is understood by persons skilled in the art, the foregoing preferred embodiments of the present disclosure are illustrative rather than limiting of the present disclosure. It is intended that they cover various modifications and that similar arrangements be included in the spirit and scope of the present disclosure, the scope of which should be accorded the broadest interpretation so as to encompass all such modifications and similar structures.

What is claimed is:

1. A display panel, comprising a light emitting layer, wherein the light emitting layer comprises:
    a pixel defining layer having a plurality of openings;
    a plurality of light emitting structures disposed in the plurality of openings; and
    a plurality of supporting structures located on the pixel defining layer;
    wherein each of the supporting structures comprises a first support column and a second support column, the first support column is a hollow cylinder, the second support column is located inside the first support column, and a height of the second support column is greater than a height of the first support column; and
    a shortest distance between the first support column and the second support column is greater than or equal to a radius or a side length of the second support column.

2. The display panel according to claim 1, wherein a central axis of the first support column and a central axis of the second support column overlap.

3. The display panel according to claim 1, wherein a projection of the first support column on a light emitting surface of the display panel and a projection of the second support column on the light emitting surface of the display panel have a same shape.

4. The display panel according to claim 3, wherein the projection of the first support column on the light emitting surface of the display panel covers the projection of the second support column on the light emitting surface of the display panel.

5. The display panel according to claim 4, wherein an area of the projection of the first support column on the light emitting surface of the display panel is greater than or equal to four times an area of the projection of the second support column on the light emitting surface of the display panel.

6. The display panel according to claim 1, wherein the second support column is a hollow cylinder.

7. The display panel according to claim 1, wherein the first support column comprises a first surface facing the second support column and a second surface away from the second support column, a projection of the first surface on a light emitting surface of the display panel is any one of a triangle, a rectangle, a circle, or a polygon, and a projection of the second surface on the light emitting surface of the display panel is any one of a triangle, a rectangle, a circle, or a polygon.

8. The display panel according to claim 7, wherein the second support column comprises a third surface facing the first support column, and a projection of the third surface on the light emitting surface of the display panel is any one of a triangle, a rectangle, a circle, or a polygon.

9. The display panel according to claim 6, wherein the second support column comprises a first surface facing the first support column and a second surface away from the first support column, a projection of the first surface on a light emitting surface of the display panel is any one of a triangle, a rectangle, a circle, or a polygon, and a projection of the second surface on the light emitting surface of the display panel is any one of a triangle, a rectangle, a circle, or a polygon.

10. The display panel according to claim 1, wherein each of the supporting structures further comprises a third support column, the third support column is a hollow cylinder surrounding the first support column, and a height of the third support column is less than the height of the first support column.

11. The display panel according to claim 10, wherein a central axis of the third support column and a central axis of the first support column overlap.

12. The display panel according to claim 10, wherein a projection of the first support column on a light emitting surface of the display panel and a projection of the second support column on the light emitting surface of the display panel have a same shape.

13. The display panel according to claim 10, wherein a projection of the third support column on a light emitting surface of the display panel covers a projection of the first support column on the light emitting surface of the display panel.

14. The display panel of claim 13, wherein an area of the projection of the third support column on the light emitting surface of the display panel is greater than or equal to four times an area of the projection of the first support column on the light emitting surface of the display panel.

* * * * *